US006645358B2

(12) United States Patent
Lupton et al.

(10) Patent No.: US 6,645,358 B2
(45) Date of Patent: Nov. 11, 2003

(54) HOLLOW CYLINDRICAL CATHODE SPUTTERING TARGET AND PROCESS FOR PRODUCING IT

(75) Inventors: David Lupton, Gelnhausen (DE); Ralf Heck, Hanau (DE); Bernd Stenger, Hammersbach (DE); Oliver Warkentin, Darmstadt (DE)

(73) Assignee: W.C. Heraeus GmbH & Co. KG (DE)

( * ) Notice: Subject to any disclaimer, the term of this patent is extended or adjusted under 35 U.S.C. 154(b) by 0 days.

(21) Appl. No.: 10/047,343

(22) Filed: Jan. 15, 2002

(65) Prior Publication Data

US 2002/0096430 A1 Jul. 25, 2002

(30) Foreign Application Priority Data

Jan. 19, 2001 (DE) .......................... 101 02 493

(51) Int. Cl.[7] .............................. C23C 14/34
(52) U.S. Cl. ..................... 204/298.13; 204/298.12; 204/298.21
(58) Field of Search ............... 204/298.12, 298.13, 204/298.21

(56) References Cited

U.S. PATENT DOCUMENTS

| 4,445,997 A | 5/1984 | McKelvey | ................. 204/298 |
| 5,317,006 A * | 5/1994 | Kumar | ................. 204/298.12 |
| 5,445,721 A | 8/1995 | Bower | ................. 204/192.12 |
| 6,365,010 B1 * | 4/2002 | Hollars | ................. 204/192.12 |

FOREIGN PATENT DOCUMENTS

| EP | 500 031 | 8/1992 | ........... C23C/14/34 |
| EP | 500 774 | 7/1997 | ........... C23C/14/35 |
| WO | WO 97/15697 | 5/1997 | ........... C23C/14/35 |

OTHER PUBLICATIONS

Japan 6–57419 Abstract.

* cited by examiner

Primary Examiner—Steven H. Ver Steeg
(74) Attorney, Agent, or Firm—Ostrolenk, Faber, Gerb & Soffen, LLP

(57) ABSTRACT

A hollow cylindrical target for a cathode sputtering unit with a hollow cylindrical sputtering material and a target holder is disclosed. The sputtering material has an annular cross section and concentrically surrounds a longitudinal segment of the target holder. The target holder extends out of the sputtering material at least at one end of the target to allow connection to the cathode sputtering unit. The at least one part of the target holder that extends from the sputtering material is a single part that can be detached from the target by at least one screw fitting.

32 Claims, 4 Drawing Sheets

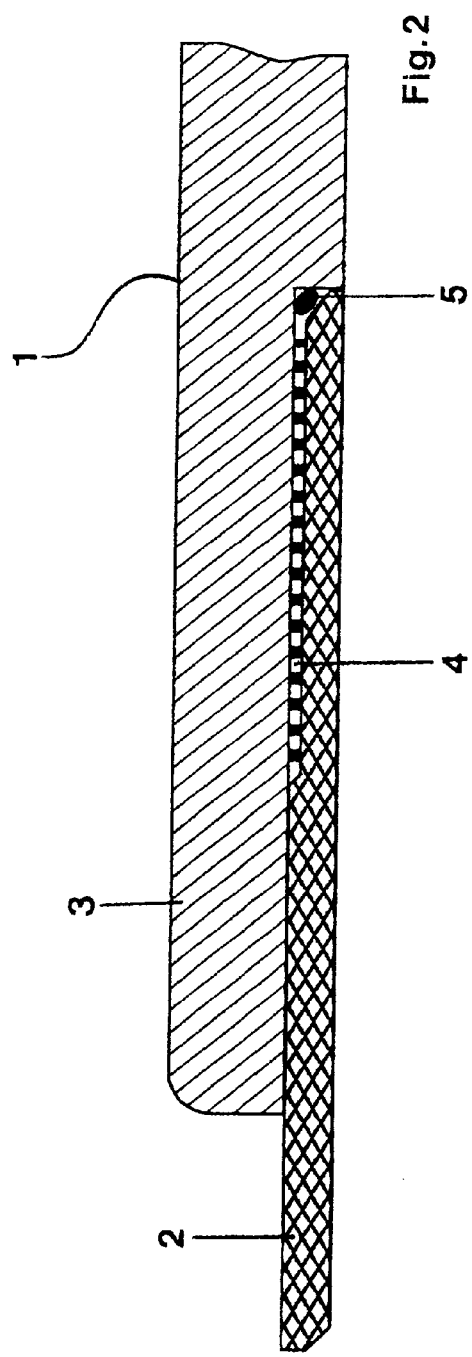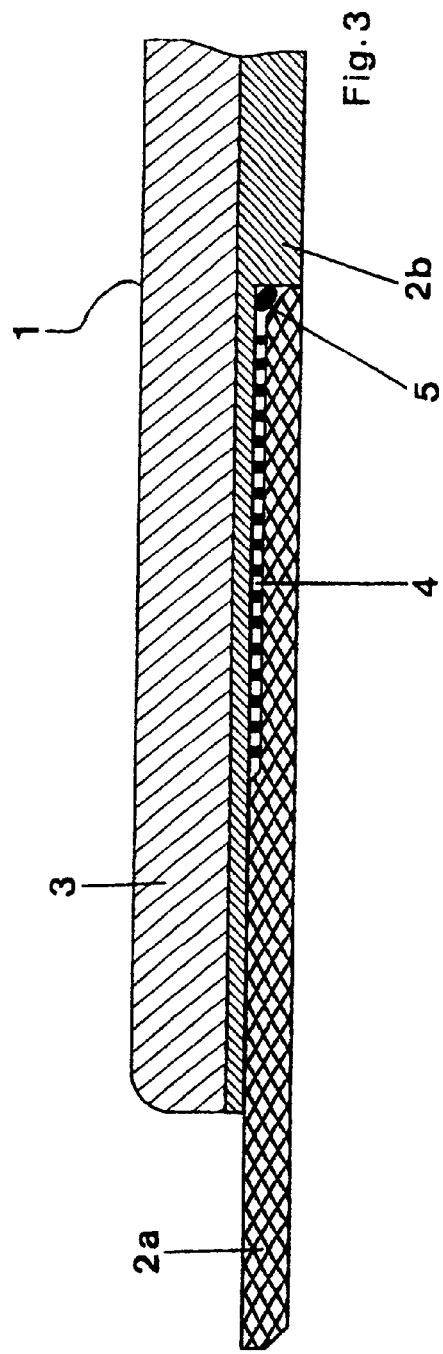

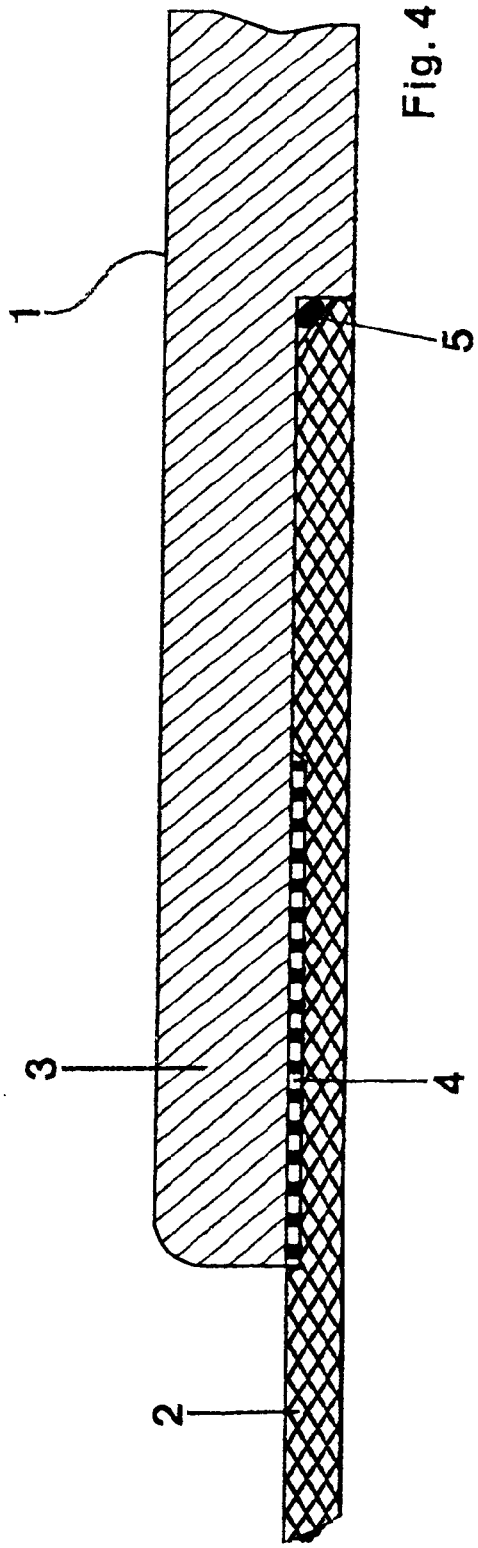
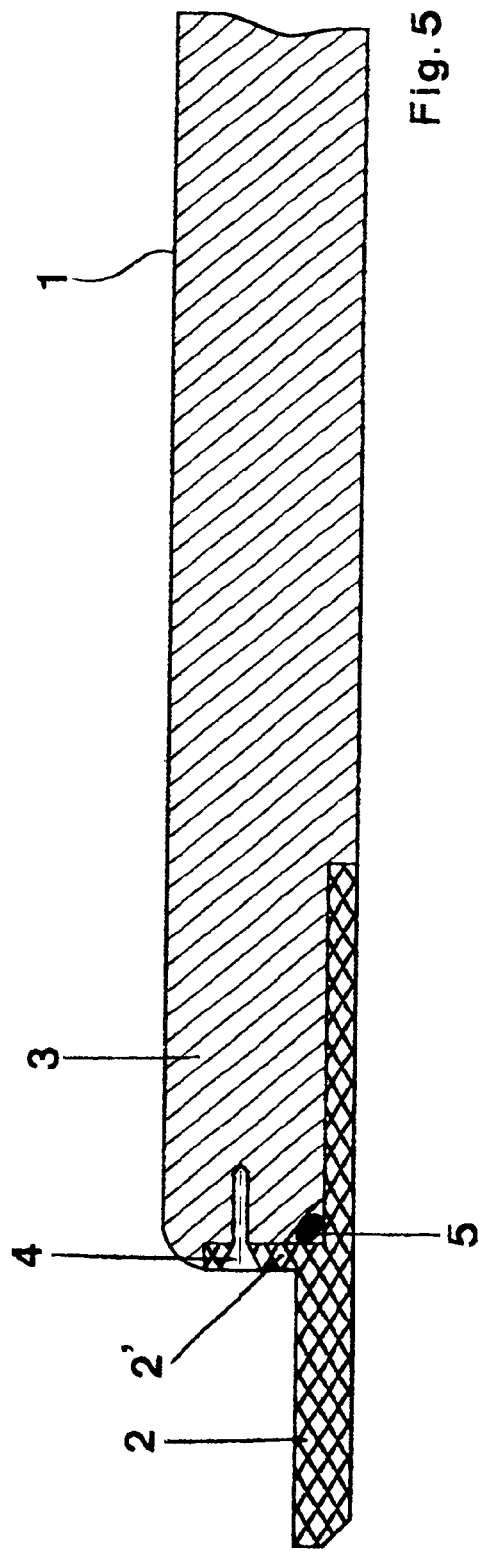

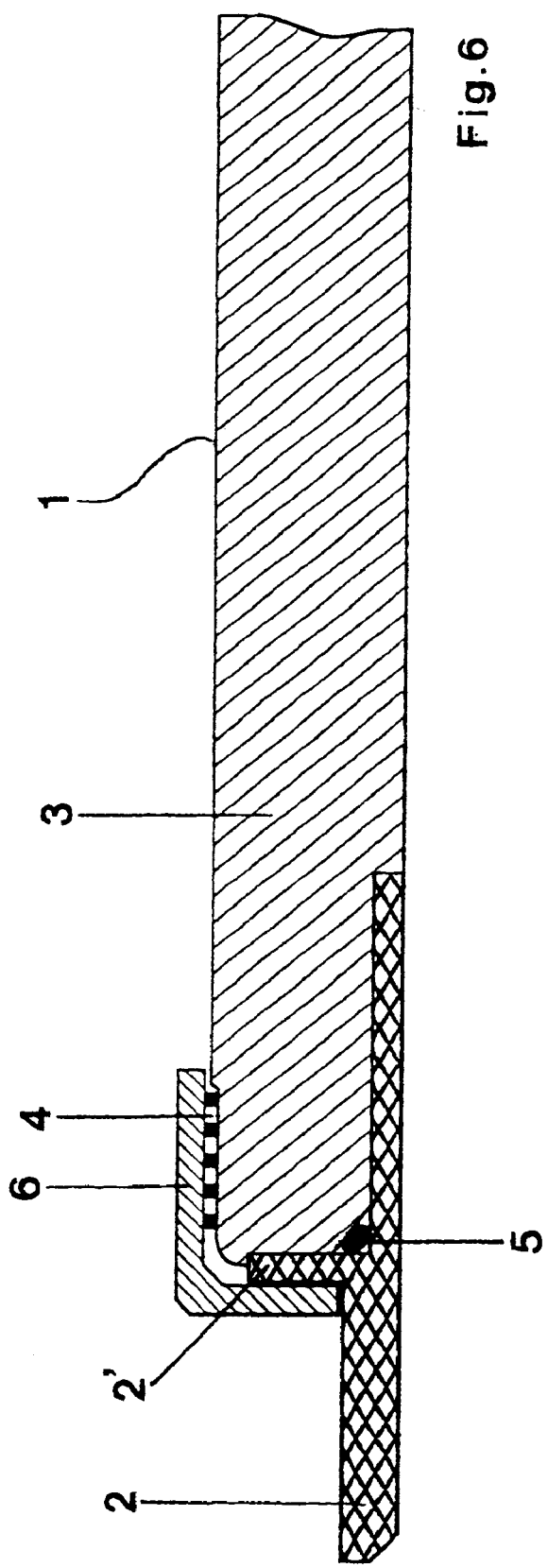

HOLLOW CYLINDRICAL CATHODE SPUTTERING TARGET AND PROCESS FOR PRODUCING IT

BACKGROUND OF THE INVENTION

The invention relates to a hollow cylindrical target for a cathode sputtering unit with a hollow cylindrical sputtering material and a target holder, in which the sputtering material has an annular cross section and concentrically surrounds a longitudinal segment of the target holder. The target holder extends out of the sputtering material at least at one end of the target to allow connection to the cathode sputtering unit. The invention also concerns a process for producing this type of target.

EP 0,500,031 B1 discloses various processes for producing a hollow cylindrical sputtering target or a hollow cylindrical target for cathode sputtering. The reference describes targets with a target holder that passes completely through the target, which are suitable especially for sputtering materials that are soft or susceptible to fracture, such as Sn or Si. The sputtering material is applied to the target holder by various processes that cause it to adhere strongly to the target holder, such as plasma spraying, flame spraying, casting in the molten state, electrodeposition, and hot pressing.

EP 0,500,774 B1 describes a sputtering system for coating large areas with a hollow cylindrical target in a vacuum chamber, in which the target is supported in a way which allows it to rotate about its longitudinal axis. Inside the hollow target there is a coolant line and an elongated magnetic structure, which is prevented from turning with the target. The reference describes the production of a hollow cylindrical target without a target holder by casting molten target material and the production of targets with a target holder made, for example, of brass and with the target material formed on the holder by plasma spraying or spraying with molten metal. The hollow cylindrical target is connected to a mounting support by a shaft at each end. The connection of the ends of a hollow cylindrical target by shafts is the method most often employed.

WO 97/15,697 shows this method for connecting a hollow cylindrical target and a mounting support in a cathode sputtering unit in the detail drawing in FIG. 1 of the reference. The target holder of a target or, in the case of mechanically stable sputtering materials, the hollow cylindrical sputtering material itself is provided at one end with a helical groove, into which a spring is inserted. A shaft, which has a flange at the contact surface with the target holder or the sputtering material and which has a groove with an O-ring in this flange, is mounted flush against the end of the target holder or sputtering material and screwed together with the target holder or sputtering material by a spacing collar. A disadvantage of this is that the machining of the helical groove in the connection region is difficult, especially in the case of long target holders. High equipment expense is required to achieve the dimensional precision in the helical groove that is required for a gastight connection.

Due to the sometimes very expensive sputtering material, cylindrical targets without a target holder are usually recycled after use by melting the remaining material and reusing it. In the case of a hollow cylindrical target with a target holder, the remaining sputtering material is removed from the target holder, e.g., by turning, and the sputtering material in the form of chips is melted and reused. The turned, clean target holder is also reused by recoating it with sputtering material. Due especially to the large target lengths of usually 2.5 to 4 m, this recycling is profitable. With respect to the previously known, single-piece target holders, the connection region of the target holder can be damaged to such an extent during shipment of the used target or by the recycling measures themselves, that reuse or resealing with a shaft, as described above, is not possible. Another disadvantage associated with recycling is that it is usually necessary to separate the sputtering material and the target holder by an expensive machining operation.

SUMMARY OF THE INVENTION

Accordingly, it is an object of the present invention to provide a hollow cylindrical target with a hollow cylindrical sputtering material and a target holder, which overcomes the disadvantages of previously known hollow cylindrical targets. In addition, it is a further object to provide a process for producing a target of this type.

The problem with respect to the development of a hollow cylindrical target is solved in the following way: The at least one part of the target holder that extends from the sputtering material is a single part that can be detached (from the remaining parts of the target) by at least one screw fitting. On the one hand, a screw fitting of this type makes it possible for a damaged connection region of a target holder to be replaced, so that the rest of the target holder can continue to be used. On the other hand, it is then possible to separate the target holder from the hollow cylindrical sputtering material by simply unscrewing it, so that machining operations would be unnecessary.

To achieve a gastight screw fitting between a first space outside the target, namely, the vacuum chamber of the cathode sputtering unit, and a second space inside the target, which is designed to hold coolant lines and magnetic equipment, the screw fitting is preferably made gastight by an O-ring seal, which is situated between the first space outside the target and the second space inside the target.

A suitable O-ring seal for the target in accordance with the invention may be made of a plastic or a soft metal, and the cross section of the O-ring seal may have any desired geometry, although a circular cross section of the O-ring seal is preferred.

Especially when the sputtering material is soft or susceptible to fracture, it has been found to be effective for the target holder to extend from the sputtering material at both ends of the target and for it to consist of a first, a second, and a third individual part, such that the first and the third individual parts extend from the sputtering material at either end of the target. This type of design makes it possible to form the first and the third individual parts with very short lengths. This makes it easier to perform the required machining operations and to achieve a high degree of dimensional precision in the production, for example, of a helical groove for the gastight connection of the first and the third individual parts to the cathode sputtering unit. In this regard, it is advantageous for the first individual part to be screwed together with the second individual part, for the second individual part to be screwed together with the third individual part, and for the second individual part to be undetachably joined along its outside diameter with the inside diameter of the hollow cylindrical sputtering material.

The first, the second, and the third individual parts are preferably screwed together by a fine thread on the outside diameter of the first individual part, on the inside diameter of the second individual part, and on the outside diameter of the third individual part.

An overlapping region of the first and second individual parts and an overlapping region of the second and third individual parts should be at least twice as long as the length of the fine thread for joining these parts. This helps with the centering and guiding of the first and third individual parts in the second individual part, which has a positive effect on the mechanical stability and durability of the screw fittings. However, the choice of the length of the overlapping region and the length of the fine thread is strongly dependent on the given sputtering material and must be redetermined for each material combination and target length.

To make it possible to easily equip the second space inside the target with the magnetic equipment and the coolant line, it has been found to be advantageous for the inside diameters of the first, the second, and the third individual parts to be the same.

Again for sputtering materials that are soft or susceptible to fracture, it was found to be effective for the target holder to extend from the sputtering material at one end of the target and for it to be constructed from a first and a second individual part, such that the first individual part extends from the sputtering material. In this regard, it is advantageous for the first individual part to be screwed together with the second individual part, and for the second individual part to be undetachably joined along its outside diameter with the inside diameter of the hollow cylindrical sputtering material. Here again, the first and the second individual parts are preferably screwed together by a fine thread on the outside diameter of the first individual part and on the inside diameter of the second individual part, and an overlapping region of the first and second individual parts should be at least twice as long as the length of the fine thread for joining the individual parts. For the reasons stated above, the inside diameters of the first and the second individual parts are preferably the same here as well.

For mechanically stable sputtering materials, it was found to be effective for the target holder to extend from the sputtering material at one end of the target and for it to be screwed directly into the hollow cylindrical sputtering material by a fine thread on the inside diameter of the hollow cylindrical sputtering material and on the outside diameter of the target holder.

Furthermore, in the case of sputtering materials of this type, it is advantageous for the target holder to extend from the sputtering material at one end of the target and for it to be directly screwed together with the hollow cylindrical sputtering material by a fine thread on the outside diameter of the hollow cylindrical sputtering material and a union joint on the target holder. In this regard, it was found to be especially effective for the longitudinal segment of the target holder that is concentrically surrounded by the sputtering material to be at least twice as long as the length of the fine thread for joining the sputtering material and the target holder. An embodiment of this type makes it possible to keep the length of the target holder very short. Here again, it is advantageous for the inside diameters of the target holder and the hollow cylindrical sputtering material to be the same.

In another advantageous embodiment of the invention for mechanically stable sputtering materials, the target holder extends from the sputtering material at one end of the target and has a flange, which is joined with the hollow cylindrical sputtering material by at least two screws at one of the end faces of the sputtering material. The inside diameters of the target holder and the hollow cylindrical sputtering material should also be the same here.

In the case of mechanically stable sputtering materials, it was also found to be effective for the target holder to be constructed from a first and a third individual part, such that the two individual parts extend from the sputtering material at either end of the target, and such that each individual part is directly screwed into the hollow cylindrical sputtering material by a fine thread on the inside diameter of the hollow cylindrical sputtering material and on the outside diameter of each of the individual parts.

It was also found to be advantageous for the target holder to be constructed from a first and a third individual part, such that the two individual parts extend from the sputtering material at either end of the target, and such that each individual part is directly screwed together with the hollow cylindrical sputtering material by a fine thread on the outside diameter of the hollow cylindrical sputtering material and a union joint on each of the individual parts. In regard to the mechanical stability of the connection, it was found to be advantageous in this case as well for the longitudinal segment of each of the individual parts of the target holder that is concentrically surrounded by the sputtering material to be at least twice as long as the length of the fine thread for joining the sputtering material and each of the individual parts. The inside diameters of the first and the third individual parts and of the hollow cylindrical sputtering material should also be the same in this case.

In the case of mechanically stable sputtering materials, it was also found to be advantageous for the target holder to be constructed from a first and a third individual part, such that the two individual parts extend from the sputtering material at either end of the target, such that each of the individual parts has a flange, and such that each flange is joined with the hollow cylindrical sputtering material by at least two screws at each of the end faces of the sputtering material. In this embodiment as well, it is advantageous for the inside diameters of the first and the third individual parts and of the hollow cylindrical sputtering material to be the same.

Various metals, such as Ag, Au, Zn, Al, Cu, Nb, Ni, Cr, and alloys of these elements, have been found to be mechanically stable sputtering materials that can be used even without a target holder that extends the entire length of the sputtering material.

Various metals, such as Si, Sn, In, Bi, and alloys of these elements, and various oxidic materials, such as ZnO, $TiO_2$, and indium tin oxide, have been found to be sputtering materials that are soft or susceptible to fracture and thus cannot be used in long lengths without a target holder that extends the entire length of the sputtering material.

High-grade steel is extremely well suited as a material for the target holder due to its strength and corrosion resistance. However, other materials with similar properties may also be used for the target holder.

The problem with respect to the creation of a process for producing a target in accordance with the invention is solved in the following way: The target holder is constructed from several individual parts; at least one individual part that extends from the sputtering material is provided with a fine thread; and either the at least one individual part that extends from the sputtering material is screwed together with another individual part of the target holder that is concentrically surrounded by the sputtering material and is undetachably joined along its outside diameter with the inside diameter of the hollow cylindrical sputtering material; or the at least one individual part that extends from the sputtering material is directly screwed together with the hollow cylindrical sputtering material by a fine thread on the hollow cylindrical sputtering material.

The problem with respect to a process is also solved by another process, in which the at least one part of the target holder that extends from the sputtering material is constructed as an individual part, which is provided with a flange, which is joined with the hollow cylindrical sputtering material by at least two screws at one of the end faces of the sputtering material.

It is advantageous if the screw fitting is made gastight by an O-ring seal, and if the O-ring seal is situated between a first space outside the target (=vacuum chamber) and a second space inside the target (=space for holding the coolant line and the magnetic equipment).

The various features of novelty which characterize the invention are pointed out with particularity in the claims annexed to and forming a part of the disclosure. For a better understanding of the invention, its operating advantages, and specific objects attained by its use, reference should be had to the drawing and descriptive matter in which there are illustrated and described preferred embodiments of the invention.

BRIEF DESCRIPTION OF THE DRAWINGS

FIGS. 2 to 6 are longitudinal sections through a target of this type or of a similar type and show various types of screw fittings.

In the Drawings:

FIG. 1 shows a connection region of a hollow cylindrical target;

FIG. 2 shows a longitudinal section through a hollow cylindrical target (view of only one wall in the connection region);

FIG. 3 shows a longitudinal section through a hollow cylindrical target with a target holder that extends the entire length of the sputtering material (view of only one wall in the connection region);

FIG. 4 shows a longitudinal section through a hollow cylindrical target (view of only one wall in the connection region) similar to FIG. 2;

FIG. 5 shows a longitudinal section through a hollow cylindrical target with a flange (view of only one wall in the connection region); and FIG. 6 shows a longitudinal section through a hollow cylindrical target with a union joint (view of only one wall in the connection region).

DETAILED DESCRIPTION OF THE PREFERRED EMBODIMENTS

Figure 1:
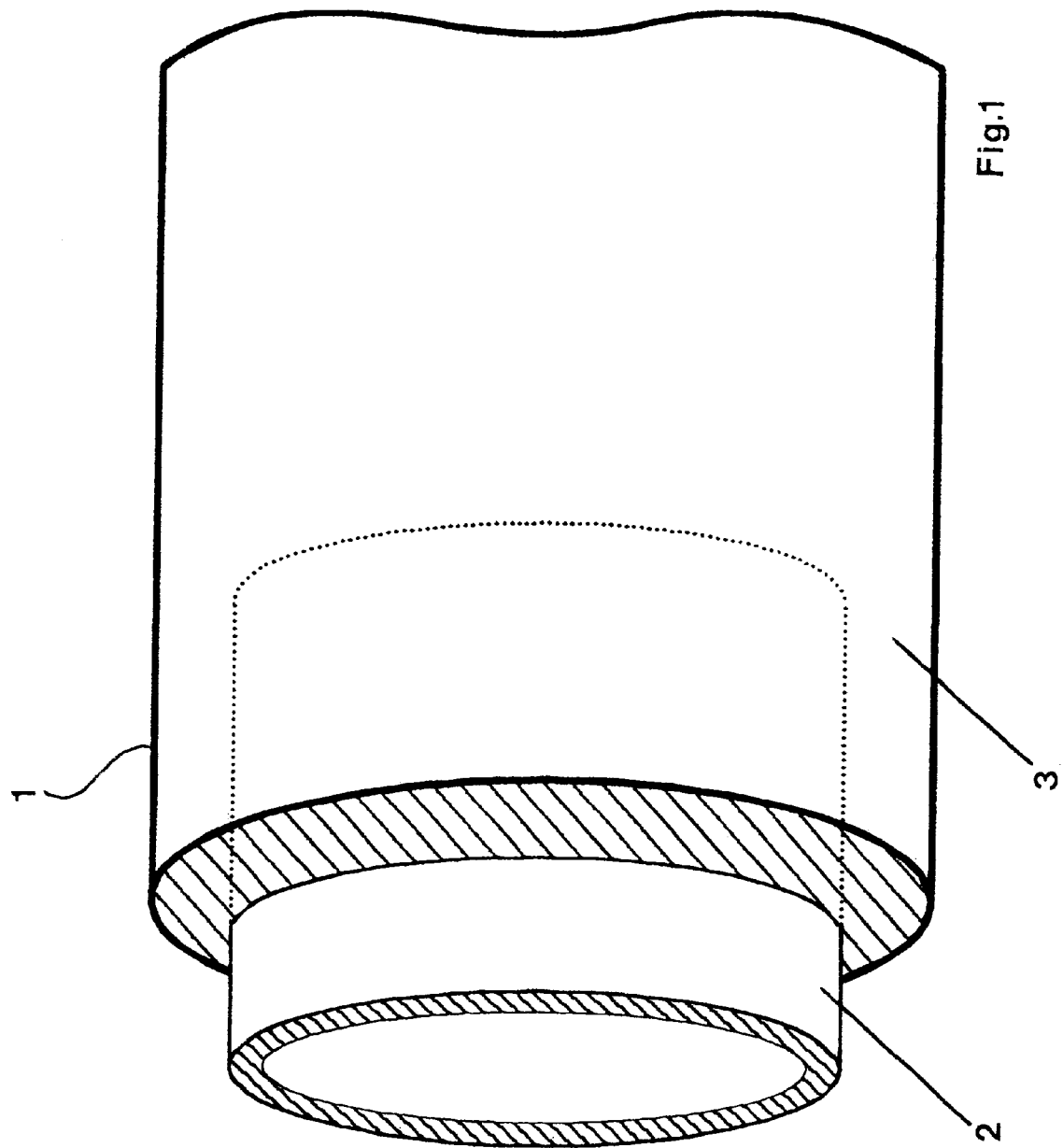
FIG. 1 is a general, three-dimensional representation of one end of a hollow cylindrical target.

FIG. 1 shows a general view of the connection region at one end of a hollow cylindrical target 1. The hollow cylindrical target 1 consists of a target holder 2 and a hollow cylindrical sputtering material 3. A longitudinal segment of the target holder 2 is concentrically surrounded by the sputtering material 3 and partially extends from the sputtering material 3. The dotted line shows how deeply the target holder 2 extends into the sputtering material 3 in this case. To mount the hollow cylindrical target 1 in a cathode sputtering unit, the part of the target holder 2 that extends from the sputtering material 3 is connected with a shaft.

FIG. 2 shows a longitudinal section through a hollow cylindrical target 1 in accordance with FIG. 1, but only one wall in the rotationally symmetric connection region is shown in this view. The target holder 2 is directly joined with the hollow cylindrical sputtering material 3 by a screw fitting 4, which is formed by an external thread on the target holder 2 and an internal thread on the sputtering material 3. The target holder 2 and the sputtering material 3 have the same inside diameter, so that there is a smooth inner contour at the transition between the target holder 2 and the sputtering material 3 in the space inside the target 1. An O-ring seal 5 between the target holder 2 and the sputtering material 3 in the region of the screw fitting 4 creates a gastight seal between the space outside the target 1 and the space inside the target 1. To allow exact seating of the O-ring seal 5, the target holder 2 is beveled in the region of contact with the O-ring seal 5. In addition, the other end of the target holder 2, i.e., the end which is connected to the shaft of the cathode sputtering unit during use, is likewise beveled in the region of contact with the shaft to allow a gastight connection at this point by well-known connection methods.

FIG. 3 shows a longitudinal section through a hollow cylindrical target 1 with a target holder 2a, 2b that extends the entire length of the target 1, but only one wall in the rotationally symmetric connection region is shown in this view. In the embodiment of the invention shown here, the target holder 2 is constructed from a first individual part 2a and a second individual part 2b, such that the first individual part 2a is joined with the second individual part 2b by the screw fitting 4, which is formed by an external thread on the first individual part 2a and an internal thread on the second individual part 2b. The second individual part 2b is undetachably joined along its outside diameter with the sputtering material 3, e.g., by application of the sputtering material 3 to the second individual part 2b by a plasma spraying process. The target holder 2a, 2b and the sputtering material 3 have the same inside diameter, so that there is a smooth inner contour at the transition between the target holder 2a, 2b and the sputtering material 3 in the space inside the target 1. An O-ring seal 5 between the first individual part 2a and the second individual part 2b in the region of the screw fitting 4 creates a gastight seal between the space outside the target 1 and the space inside the target 1. To allow exact seating of the O-ring seal 5, the first individual part 2a is beveled in the region of contact with the O-ring seal 5. In addition, the other end of the target holder 2a, 2b, i.e., the end which is connected to the shaft of the cathode sputtering unit during use, is likewise beveled in the region of contact with the shaft to allow a gastight connection at this point by well-known connection methods.

FIG. 4 shows an assembly similar to FIG. 2 with a longitudinal section through a hollow cylindrical target 1 in accordance with FIG. 1. The target holder 2 is again directly joined with the hollow cylindrical sputtering material 3 by a screw fitting 4, which is formed by an external thread on the target holder 2 and an internal thread on the sputtering material 3. In contrast to FIG. 2, in this embodiment of the invention, the screw fitting 4 is located farther from the O-ring seal 5.

FIG. 5 shows a longitudinal section through a hollow cylindrical target 1, but only one wall in the rotationally symmetric connection region is shown in this view. The target holder 2 has a flange 2', which is joined with one of the end faces of the hollow cylindrical sputtering material 3 by a screw fitting 4. In this case, the screw fitting 4 consists of individual screws, which are turned directly into the sputtering material 3. The target holder 2 and the sputtering material 3 have the same inside diameter, so that there is a smooth inner contour at the transition between the target holder 2 and the sputtering material 3 in the space inside the target 1. An O-ring seal 5 between the target holder 2 and the sputtering material 3 in the region of the screw fitting 4 creates a gastight seal between the space outside the target 1 and the space inside the target 1. To allow exact seating of the O-ring seal 5, the sputtering material 3 is beveled in the region of contact with the O-ring seal 5. In addition, the other end of the target holder 2, i.e., the end which is connected to the shaft of the cathode sputtering unit during use, is likewise beveled in the region of contact with the shaft to allow a gastight connection at this point by well-known connection methods.

FIG. 6 shows a longitudinal section through a hollow cylindrical target 1 similar to FIG. 1, but only one wall in the rotationally symmetric connection region is shown in this view. The target holder 2 has a flange 2', which is joined with the hollow cylindrical sputtering material 3 by a union joint 6. In this case, the screw fitting 4 is formed by the specified union joint 6 and an external thread on the sputtering material 3. The target holder 2 and the sputtering material 3 have the same inside diameter, so that there is a smooth inner contour at the transition between the target holder 2 and the sputtering material 3 in the space inside the target 1. An O-ring seal 5 between the target holder 2 and the sputtering material 3 in the region of the end face of the sputtering material 3 creates a gastight seal between the space outside the target 1 and the space inside the target 1. To allow exact seating of the O-ring seal 5, the sputtering material 3 is beveled in the region of contact with the O-ring seal 5. In addition, the other end of the target holder 2, i.e., the end which is connected to the shaft of the cathode sputtering unit during use, is likewise beveled in the region of contact with the shaft to allow a gastight connection at this point by well-known connection methods.

EXAMPLE

A hollow cylindrical target in accordance with FIGS. 1 and 2 is constructed with a sputtering material 3 made of silver and a target holder 2 made of high-grade steel, both of which have an inside diameter of 125 mm. The total thickness of the sputtering material 3 is 13.5 mm, and that of the target holder is 3.75 mm. In the longitudinal region in which the sputtering material 3 is to concentrically surround the target holder 2, the inside diameter of the hollow cylindrical sputtering material 3 is enlarged and provided with a fine thread over a portion of this longitudinal region, so that the target holder 2 can be inserted. The length of the enlargement of the inside diameter is selected in such a way that an 80-mm-long overlapping region of the target holder 2 and the sputtering material 3 is produced. 40 mm is selected as the length of the fine thread on the inside diameter of the sputtering material 3 and on the outside diameter of the target holder 2. By selecting the length of the overlapping region to be at least twice the length of the fine thread, the target holder 2 is easily guided and centered in the sputtering material 3. In addition, the outside diameter of the target holder 2 is selected in such a way that the target holder 2 can be inserted into the sputtering material 3 with a close fit and as little play as possible. After the O-ring seal 5 has been inserted, the target holder 2 is screwed directly into the sputtering material 3. The O-ring seal 5 ensures a gastight connection.

Thus, while there have been shown and described and pointed out fundamental novel features of the present invention as applied to a preferred embodiment thereof, it will be understood that various omissions and substitutions and changes in the form and details of the devices illustrated, and in their operation, may be made by those skilled in the art without departing from the spirit of the present invention. For example, it is expressly intended that all combinations of those elements and/or method steps which perform substantially the same function in substantially the same way to achieve the same results are within the scope of the invention. Substitutions of elements from one described embodiment to another are also fully intended and contemplated. It is also to be understood that the drawings are not necessarily drawn to scale but that they are merely conceptual in nature. It is the intention, therefore, to be limited only as indicated by the scope of the claims appended hereto.

We claim:

1. A hollow cylindrical target for a cathode sputtering unit, comprising a hollow cylindrical sputtering material; and hollow cylindrical target holder, the sputtering material having an annular cross section and being arranged to concentrically surround a longitudinal segment of the target holder so that t least one end of the target holder extends from the sputtering material at least at one en of the target so as to be connectable to the cathode sputtering unit, the at least one end f the target holder that extends from the sputtering material being an individual part that is detachable by at least one screw fitting.

2. A hollow cylindrical target in accordance with claim 1, and further comprising an O-ring seal situated between a first space outside the target and a second space inside the target so as to seal the screw fitting to be gastight.

3. A hollow cylindrical target in accordance with claim 1, the target holder extends from the sputtering material at both ends of the target and includes a first individual part, a second individual part, and a third individual part such that the first and the third individual parts extend from the sputtering material at either end of the target.

4. A hollow cylindrical target in accordance with claim 3, wherein the first individual part is screwed together with the second individual part, the second individual part is screwed together with the third individual part, and the second individual part is fixed along its outside diameter with an inside diameter of the hollow cylindrical sputtering material.

5. A hollow cylindrical target in accordance with claim 4, wherein the first, the second, and the third individual parts are screwed together by a fine thread on an outside diameter of the first individual part, on an inside diameter of the second individual part, and on an outside diameter of the third individual part.

6. A hollow cylindrical target in accordance with claim 5, wherein an overlapping region of the first and second individual parts and an overlapping region of the second and third individual parts is at least twice as long as a length of the fine thread for joining these parts.

7. A hollow cylindrical target in accordance with claim 3, wherein the first, the second and the third individual parts have an equal inside diameter.

8. A hollow cylindrical target in accordance with claim 1, wherein the target holder extends from the sputtering material at one end of the target and is constructed from a first individual part and a second individual part, the first individual part extending from the sputtering material.

9. A hollow cylindrical target in accordance with claim 8, wherein the first individual part is screwed together with the second individual part, the second individual part being fixed along its outside diameter with an inside diameter of the hollow cylindrical sputtering material.

10. A hollow cylindrical target in accordance with claim 9, wherein the first and the second individual parts are screwed together by a fine thread on an outside diameter of the first individual part and on an inside diameter of the second individual part.

11. A hollow cylindrical target in accordance with claim 10, wherein an overlapping region of the first and second individual parts is at least twice as long as a length of the fine thread for joining the first and second individual parts.

12. A hollow cylindrical target in accordance with claim 8, wherein the inside diameters of the first and the second individual parts have an equal inside diameter.

13. A hollow cylindrical target in accordance with claim 1, wherein the target holder extends from the sputtering material at one end of the target and is screwed directly into the hollow cylindrical sputtering material by a fine thread on an inside diameter of the hollow cylindrical sputtering material and on an outside diameter of the target holder.

14. A hollow cylindrical target in accordance with claim 13, wherein a longitudinal segment of the target holder that is concentrically surrounded by the sputtering material is at least twice as long as length of the fine thread for joining the sputtering material and the target holder.

15. A hollow cylindrical target in accordance with claim 13, wherein inside diameters of the target holder and the hollow cylindrical sputtering material are equal.

16. A hollow cylindrical target in accordance with claim 1, and further comprising a union joint having a fine thread screwed to a fine thread on an outside diameter of the hollow cylindrical sputtering material so that the target holder extends from the sputtering material at one end of the target and is directly screwed together with the hollow sputtering material.

17. A hollow cylindrical target in accordance with claim 16, wherein a longitudinal segment of the target holder that is concentrically surrounded by the sputtering material is at least twice as long as a length of the fine thread for joining the sputtering material and the target holder.

18. A hollow cylindrical target in accordance with claim 16, wherein inside diameters of the target holder and the hollow cylindrical sputtering material are equal.

19. A hollow cylindrical target in accordance with claim 1, wherein the target holder extends from the sputtering material at one end of the target and has a flange, and further comprising at least two screws arranged to join the flange with the hollow cylindrical sputtering material at an end face of the sputtering material.

20. A hollow cylindrical target in accordance with claim 19, wherein the target holder and the hollow cylindrical sputtering material have an equal inside diameter.

21. A hollow cylindrical target in accordance with claim 1, wherein the target holder includes two individual parts, the two individual parts being arranged to extend from the sputtering material at respective ends of the target, each individual part being directly screwed into the hollow cylindrical sputtering material by a fine thread on an inside diameter of the hollow cylindrical sputtering material and on an outside diameter of each of the individual parts.

22. A hollow cylindrical target in accordance with claim 21, wherein a longitudinal segment of each of the individual parts of the target holder that is concentrically surrounded by the sputtering material is at least twice as long as a length of the fine thread for joining the sputtering material and each of the individual parts.

23. A hollow cylindrical target in accordance with claim 21, wherein inside diameters of the two individual part and of the hollow cylindrical sputtering material are equal.

24. A hollow cylindrical target in accordance with claim 1, wherein the target holder includes two individual parts, the two individual parts being arranged to extend from the sputtering material at respective ends of the target, each individual part being directly screwed together with the hollow cylindrical sputtering material by a fine thread on an outside diameter of the hollow cylindrical sputtering material and a union joint on each of the individual parts.

25. A hollow cylindrical target in accordance with claim 24, wherein a longitudinal segment of each of the individual parts of the target holder that is concentrically surrounded by the sputtering material is at least twice as long as a length of the fine thread for joining the sputtering material and each of the individual parts.

26. A hollow cylindrical target in accordance with claim 24, wherein inside diameters of the two individual part and of the hollow cylindrical sputtering material are equal.

27. A hollow cylindrical target in accordance with claim 1, wherein the target holder includes two individual parts, the two individual parts being arranged to extend from the sputtering material at respective ends of the target, each of the individual parts having a flange, and further comprising a plurality of screws whereby each flange is joined with the hollow cylindrical sputtering material by at least two of the screws at each of end face of the sputtering material.

28. A hollow cylindrical target in accordance with claim 27, wherein inside diameters of the individual parts and of the hollow cylindrical sputtering material are equal.

29. A hollow cylindrical target in accordance with claim 1, wherein the sputtering material is composed of one of the group consisting of Ag, Au, Zn, Al, Cu, Nb, Ni, Cr, and an alloy of these elements.

30. A hollow cylindrical target in accordance with claim 1, wherein sputtering material is composed of one of the group consisting of Si, Sn, In, Bi, and an alloy of these elements.

31. A hollow cylindrical target in accordance with claim 1, wherein the sputtering material is composed of one of ZnO, $TiO_2$, and indium tin oxide.

32. A hollow cylindrical target in accordance with claim 1, wherein the target holder is composed of high-grade steel.

* * * * *